(12) United States Patent
Farahvash et al.

(10) Patent No.: US 8,565,698 B1
(45) Date of Patent: Oct. 22, 2013

(54) METHOD AND APPARATUS FOR INTEGRATING POWER AMPLIFIERS WITH PHASE LOCKED LOOP IN A SINGLE CHIP TRANSCEIVER

(75) Inventors: Shayan Farahvash, Cupertino, CA (US); Nathaniel King, Jr., Morgan Hill, CA (US); Robert A. Koupal, San Leandro, CA (US); David A. Schwan, San Jose, CA (US); Matthew C. Romney, Alpine, UT (US); Chee Quang Quek, Sunnyvale, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 35 days.

(21) Appl. No.: 12/974,730

(22) Filed: Dec. 21, 2010

Related U.S. Application Data (62) Division of application No. 11/724,391, filed on Mar. 14, 2007, now Pat. No. 7,881,679.

(51) Int. Cl.
*H04B 1/04* (2006.01)

(52) U.S. Cl.
USPC ........................................ 455/118; 455/114.2

(58) Field of Classification Search
USPC .......... 455/91, 112, 114.2, 118, 127.1, 127.3, 455/114.1, 114.3, 120, 123
See application file for complete search history.

(56) References Cited

U.S. PATENT DOCUMENTS

| 6,055,655 | A | 4/2000 | Momohara |
| 6,349,067 | B1 | 2/2002 | Hsu et al. |
| 6,563,181 | B1 | 5/2003 | Du et al. |
| 6,917,095 | B1 | 7/2005 | Wong |
| 7,608,913 | B2 | 10/2009 | Secareanu et al. |
| 7,702,359 | B2 * | 4/2010 | Tanaka et al. ............. 455/552.1 |
| 2005/0014476 | A1 * | 1/2005 | Oono et al. ................. 455/118 |
| 2005/0068014 | A1 * | 3/2005 | Dillon et al. ................ 323/268 |
| 2007/0194394 | A1 | 8/2007 | Secareanu et al. |
| 2008/0045162 | A1 | 2/2008 | Rofougaran et al. |
| 2008/0139143 | A1 * | 6/2008 | Roufoogaran et al. ....... 455/126 |
| 2008/0261650 | A1 * | 10/2008 | Piriyapoksombut et al. ..................... 455/552.1 |

OTHER PUBLICATIONS

Notice of Allowance mailed Sep. 27, 2010 for U.S. Appl. No. 11/724,391.
Non-Final Rejection mailed Jun. 23, 2010 for U.S. Appl. No. 11/724,391.

* cited by examiner

*Primary Examiner* — Blane J Jackson
(74) *Attorney, Agent, or Firm* — Withrow & Terranova, P.L.L.C.

(57) ABSTRACT

A phase locked loop and power amplifier are integrated on a single chip. To eliminate cross-talk between the components, a frequency translation block is introduced to change the output frequency of the PLL. To isolate the components from unwanted feedback, a high isolation buffer is introduced between the components. To further isolate the components, the voltage supply domains for each component are physically separated. Each separate voltage supply domain can include a separate high isolation ring, separate voltage regulator, and separate bandgap reference.

3 Claims, 10 Drawing Sheets

| Trace Width (um) | Inductance (pH) |
|---|---|
| 1 | 564 |
| 2.5 | 543 |
| 5 | 515 |
| 10 | 470 |
| 20 | 447 |

Table 1

Fig. 13

METHOD AND APPARATUS FOR INTEGRATING POWER AMPLIFIERS WITH PHASE LOCKED LOOP IN A SINGLE CHIP TRANSCEIVER

This application is a Divisional of U.S. patent application Ser. No. 11/724,391, filed Mar. 14, 2007, now U.S. Pat. No. 7,881,679, the disclosure of which is incorporated herein by reference in its entirety.

FIELD OF INVENTION

The present invention relates to the field of integrated circuits. More particularly, the present invention relates to the field of integrated circuit design of phase locked loops and power amplifiers.

BACKGROUND

The phase locked loop (PLL) is a common method of frequency synthesis in modern communications. Conventional PLLs are integral components in wireless communication transceivers and are also used for FM and AM modulation and demodulation, data and tape synchronization, frequency shift keying, tone decoding, frequency multiplication and division, signal regeneration, and control mechanisms in robotics, radio and satellite. A PLL normally includes a phase detector and a voltage controlled oscillator (VCO). A PLL can also include a divider, loop filter, or a number of other devices depending on the intended output frequency of the PLL.

PLLs are commonly used as frequency determining circuit components. The PLL is normally configured to receive a produce a desired output frequency that is an integer or fractional multiple of a reference frequency. Specifically, in a conventional PLL, the reference frequency is coupled to a phase detector. The phase detector is coupled to a VCO. The phase detector is configured to receive the reference frequency and also the output frequency generated by the VCO. The phase detector transmits, and the VCO is configured to receive, a voltage control signal based on a phase difference between the reference frequency and the output frequency. The voltage control signal adjusts the oscillation of the VCO until the phase of the output frequency matches the phase of the reference frequency. This feedback loop causes the output frequency to phase lock on the reference frequency.

If a higher or lower output frequency is desired, a frequency divider or multiplier can be introduced between the output frequency of the VCO and the phase detector to manipulate the frequency to be smaller or larger. To simplify this discussion, only a divider will be considered though a multiplier can be substituted for the divider. A divider can be configured to receive the output frequency and transmit a manipulated frequency to the phase detector based on the value of the divider. The phase detector generates a voltage control signal to the VCO in response to differences between the reference frequency and the manipulated frequency. The voltage control signal is provided until the phase of the reference frequency matches the phase of the manipulated frequency. The PLL thereby phase locks on a fraction or multiple of the reference frequency. Thus, a variety of frequencies can be produced from a single reference frequency by changing the value of the divider.

In current generation circuit design of transceivers, the output of the PLL is coupled to a mixer. The mixer typically uses the frequency output from the PLL to modulate or demodulate an input signal to form a modulated signal. In transmitters, the mixer is usually coupled to a power amplifier (PA). The PA is configured to receive and amplify the modulated signal to transmit an output signal. The PA in particular uses a large amount of power to amplify the voltage and current of the modulated signal to produce the desired output signal.

Difficulties have been encountered which prevent the integration of the PLL and the PA on a single integrated circuit chip. One common problem is cross-talk between the components because the PLL and PA normally operate at similar frequencies.

Cross-talk can manifest itself in various highly undesirable fashions such as injection locking, increased phase noise, greater error vector magnitude in the transmitter and reduction in adjacent channel power rejection in the transmitter. Normally these problems are a direct result of a limited isolation between layout traces, bondwires, and supplies.

Injection locking is particularly troublesome for integrated transceivers. There, the unwanted feedback from the PA is the primary cause. The PA generates unwanted feedback because of the high power drawn to amplify the modulated signal. Frequently, harmonics are generated at the operating frequency of the PA. The unwanted feedback is parasitically coupled to the PLL and degrades its performance. The unwanted feedback alters the voltage control signal of VCO which causes the VCO to phase lock on the power and/or unwanted feedback of the PA rather than the desired multiple of the reference frequency.

Like all other amplifiers, stability is of major concern because PAs can have significant power gains (e.g. as high as 30 dB). Consequently any parasitic feedback between stages can severely jeopardize the stability of the power. For transceivers where the amplifier is working in Class-C, the Power Added Efficiency (PAE) is another major concern. Traditionally, to increase PAE by decreasing the resistance of the transistor ports in the power amplifier, the traces coupled to the transistor ports are made thicker. However, the frequencies at which integrated circuits for wireless applications operate, generally known as microwave frequencies, a phenomenon known as the "skin depth effect" causes a significant portion the current to be concentrated around small areas around the corners of the traces. Increasing the width of traces to compensate does not give the current a wider path to travel past corners. As such, any increase in width of a trace typically does not change the current distribution inside a trace, and therefore the parasitic inductance of a trace remains substantially unchanged. Additionally, the increase in width in traces increases parasitic capacitance. To compete with traditional discrete PAs made in GaAs or other compound semiconductor technology, any integrated silicon-based PA must exhibit a PAE better than 35%. For an integrated transceiver, the aforementioned requirement must be met when all parasitic elements such as parasitic inductors and parasitic capacitors created unintentionally by the IC layout process are accounted for. For microwave applications, there will be no clear-cut border between schematic and layout. That is, non-intentional parasitic elements formed during layout can have comparable values to the intentional circuit elements used for matching and coupling. The influence of these parasitic elements, however, is mostly detrimental. Thus, a layout technique is needed to reduce parasitic inductance as well as inductive coupling.

Electrostatic discharge protection problems have also caused difficulties which prevent integration of a PLL and PA on a single chip. Subcircuits on a conventional integrated circuit share a common voltage supply and a common ground connection. This allows noise generated in one circuit to be provided to another circuit. Further, if one subcircuit has an ESD event, the charge flows into the common voltage supply or common ground and can affect the negatively performance of other subcircuits.

In addition, bandgap references and voltage regulators and their corresponding bypass capacitors are commonly found in integrated transceivers. They provide the biasing for the PA and PLL but also provide and potential feedback path for unwanted coupling between the PA and PLL.

The current demand for lower cost and better performance hardware creates a need for the integration of a PLL and PA on a single chip. In addition, this integration would eliminate the need for special drivers and an external PA reducing overall power consumption. Moreover, this integration would increase the yield of the circuit board due to the reduced number of components. Before this invention, no successful integration of a PLL and PA on a single chip has been achieved.

SUMMARY OF INVENTION

An integrated phase locked loop and power amplifier circuit is disclosed.

In one embodiment, the integrated phase locked loop and power amplifier circuit comprises a phase locked loop circuit (PLL) coupled to a frequency translation block. The frequency translation block is coupled to a mixer. The mixer is/coupled to a power amplifier (PA). The PLL is configured to transmit, and the frequency translation block is configured to receive, a single tone signal. The frequency translation block then changes the input tone to another signal with a frequency different from the input frequency. The mixer receives the modulated frequency and an input signal. The mixer modulates the input signal with the modulated frequency to transmit a modulated signal. The mixer then transmits, and the PA is configured to receive, the modulated signal. The PA amplifies the modulated signal and transmits an output signal. The PLL and PA operate at a different frequency thereby diminishing the cross-talk between the components.

To substantially diminish cross-talk between the PLL and PA, the PLL preferably operates at double the frequency of the PA. Thus, an N/2 divider is preferably used as a frequency translation block. By way of example, the PLL can operate at 3.8 GHz while the PA operates at 1.9 GHz. In other embodiments of the invention the PLL and PA can be configured to operate at a number of different frequencies using a variety of techniques and components. For example, the VCO can operate at a lower, higher, or any multiple frequency of the PA. Also, in alternate embodiments, the frequency translation block can be a frequency translation block with high isolation. This embodiment isolates the PLL from the PA while diminishing cross-talk between the components.

In another embodiment of the invention, an increase gain is provided while simultaneously enhancing stability in an integrated power amplifier. This is achieved by effectively reducing degeneration inductance of common emitter stages. Reducing the emitter degeneration for single-ended amplifier increases the gain for a given bias current and consequently enhances the PAE. Moreover, this technique enhances the stability of a multi-stage power amplifier by reducing the interstage feedback between single-ended cascaded stages. The current through any transistor port in the integrated circuit is divided into equal parts by coupling the ports into a desired amount of traces of the same length and resistivity so that the current leaving the transistor port would naturally divide into the same number of equal parts. Further, the traces are oriented such that the magnetic fields formed by the flow of current across the traces are opposite in polarity. These magnetic fields, if not managed properly, result in parasitic feedback to the power amplifier which severely degrades performance, mostly manifesting itself as instability in the power amplifier. When the disclosed technique is used, the magnetic fields are opposite in polarity and the parasitic effects are greatly reduced.

The equation for calculating the effective inductance, $L_{EFF}$ of two parasitic or intentional inductive elements is shown below in equation (1):

$$L_{eff} = \frac{L_1 L_2 (1 - k^2)}{L_1 + L_2 - 2k\sqrt{L_1 L_2}} \tag{1}$$

Where L1 and L2, which can be parasitic or intentional inductive elements are the same value L, equation (1) can be simplified as equation (2):

$$L_{eff} = \frac{L}{2}(1 + k) \tag{2}$$

When the magnetic fields formed by current flowing through these elements are opposite polarity as prescribed by this layout technique, the coupling coefficient k is negative, and therefore $L_{EFF}$ is less than half of any one inductive element. By employing this layout technique the unavoidable single-ended degeneration caused by the emitter inductance is effectively reduced to the point that its corresponding impedance can be neglected even at such high frequency as 5.8 GHz. If this technique is not used, the self-inductance of a trace could effectively reduce the gain of a single ended power amplifier, and would have to be compensated by an increase in $g_m$ via increasing the bias current of the transistor. Although feasible, and widely used in practice today, this clearly would put an integrated amplifier solution in a disadvantageous position compared to its discrete counterparts.

In another embodiment of the invention, a first high isolation buffer is placed after the PLL and another can be placed after the mixer. The first high isolation buffer is configured to receive and transmit the output frequency of the phase locked loop circuit. The first high isolation buffer is also coupled to a mixer. The mixer receives and modulates the output frequency transmitted by the high isolation buffer with an input signal thereby forming a modulated signal. The mixer is coupled to a second high isolation buffer. The modulated signal from the mixer is transmitted to the second high isolation buffer, which is configured to receive it and transmit the modulated signal to the power amplifier. The power amplifier receives the modulated signal, amplifies it, and transmits it as an output signal. By introducing the first high isolation buffer after the PLL, the feedback path between the PLL and PA is substantially severed. By introducing the second high isolation buffer after the mixer, the feedback path is further severed. Preferably, any high isolation buffers are a high isolation amplifiers. In alternate embodiments, the high isolation buffers can be a replicated with a number of components and techniques.

In yet another embodiment of the invention, the PLL and PA are isolated by having separate voltage supply domains, each having its own voltage supply and ground connection. While this increases the pin count of the integrated circuit package it does improve circuit performance by reducing cross talk paths. In this embodiment, the integrated phase locked loop and power amplifier circuit comprises a phase locked loop circuit configured to transmit an output frequency. The phase locked loop circuit has a local voltage source and ground connection that is separate from the voltage source and ground connection of the PA. A mixer is coupled to the phase locked loop circuit and is configured to receive the output frequency from the PLL. The mixer is also configured to receive an input signal. The mixer modulates the output frequency with the input signal thereby forming a modulated signal. The mixer transmits, and the PA is configured to receive, the modulated signal. The PA amplifies the modulated signal thereby forming an output signal. The PA then transmits the output signal. The PA has its own local voltage source and ground connection. The voltage source and ground connection for the PA is separate from the voltage source and ground connection for the PLL.

In one embodiment, two guard ring sets are used to further isolate the PLL and the PA. One guard ring set is coupled to the voltage supply domain of the PLL, while the other is coupled to the separate voltage supply domain of the PA. The guard ring sets have two or more components. The first component is similar in construction to the collector portion of an NPN transistor, known as a collector ring. A collector ring is also used in the art as a VCC ring. The second component is substrate contact ring consisting of a heavily doped P region. This heavily doped P region is also known as a ground ring. A third optional component includes of a deep trench. Preferably the collector rings have an N Buried layer, and use a deep N+ region, known as a sinker, to couple to the N buried layer. The materials used in these collector rings are preferably formed of a low sheet rho on the order of 10 to 20 ohms/square, or lower, such that the collector rings to have low impedance. Preferably, the N buried layer and sinker combination are deeper than the heavily doped P region, or alternatively, the N buried layer and sinker combination are at least as deep as the heavily doped P region. This will cause any noise to go through the more resistive P substrate, which will attenuate the noise more efficiently. Preferably the deep trench, if used, is deeper than the N Buried layer implant. This provides for higher isolation on the substrate than normal CMOS process technology, or alternatively, the deep trench is at least as deep as the N Buried layer. In an alternate embodiment any low impedance material which is as deep or deeper than any well implant can be used as a guard ring set. In alternate embodiments, other components on the integrated chip can have separate voltage supply domains to further increase isolation. For example, the mixer can have a separate local voltage supply and local ground connection. For the mixer to remain ESD robust, the mixer can also have its own third guard ring set coupled to its local voltage supply and ground connection.

The above embodiment physically separates the voltage source and ground connections of the PLL and PA to substantially reduce unwanted feedback. Also, by introducing two separate isolation rings, the circuit remains ESD robust. For example, if an ESD event is generated from a local component, the charge is collected and disposed locally rather than being fed through a common voltage supply connection to a single isolation ring. Thus, the other component is not affected by the ESD event. Also, noise generated by one component will not affect the other because the feedback path between them has been severed.

In yet another embodiment of the invention, separate voltage regulators are introduced in the each of voltage supply domains of the PLL and PA. By having separate voltage regulators, the path between the components through the common voltage regulator is severed and the isolation between the components is improved.

In alternate embodiments, to further isolation, the voltage regulators in each of the supply domains for the components can have separate bandgap references. This further isolates the components by removing another normally used common connection. In alternate embodiments, other components on the integrated chip can also have separate voltage regulators and bandgap references in their separate voltage supply domains. For example, the mixer can have a separate voltage regulator in its voltage supply domain and a separate bandgap reference for the voltage regulator to further increase isolation.

In yet another embodiment of the invention, separate bypass capacitors are introduced into the supply domains of the PLL and PA. In addition, another, second bypass capacitor is coupled to the local voltage source and ground connection for the PA which is separate from the bypass capacitor for the PLL. By having separate bypass capacitors, the path between the components is severed and the isolation between the components is improved.

Additional measures in other embodiments can be taken to isolate the PLL from the PA. Specifically, the PLL and PA can be located as far away from each other as possible during chip floor planning. In another embodiment, different supply pins for the PLL and PA are used and the pins are placed on different sides of the chip. These arrangements will diminish the possibility of unwanted interference between the components and allow for the integration of a PLL and PA on a single chip. This will also substantially reduce unwanted coupling through bond wires or package leads. Additional embodiments can combine any and/or all of the embodiments herein described. For example, a PLL can be coupled to a high isolation buffer followed by a frequency translation block. In this example, isolation between components is furthered while cross-talk is diminished.

DETAILED DESCRIPTION OF THE DRAWINGS

The integrated phase locked loop and power amplifier circuit of the present invention integrates a phase locked loop circuit (PLL) and power amplifier (PA) on a single chip by modulating the operating frequency of the components or significantly isolating each component or both, thereby diminishing unwanted cross-talk or feedback, or both. In one embodiment, a frequency translation block modulates the output frequency of the PLL thereby operating the PLL and PA at different frequencies. In another embodiment, a high isolation buffer is introduced after the PLL to isolate the PLL from any feedback generated by the PA. In yet another embodiment, the PLL and PA are supplied power with separate voltage supply domains. In one embodiment, a layout technique reducing degeneration inductance of common emitter stages is applied thereby increasing the power added efficiency of the power amplifier and enhancing its stability of the power amplifier by preventing inter stage coupling. In another embodiment, each voltage supply domain contains a local voltage supply connection and a local ground connection and a high isolation ring coupled to the local voltage supply and local ground connection. The separate voltage supply domains provide the PLL and PA with robust electrostatic discharge (ESD) protection while severing the common ground connection thereby eliminating noise or feedback, or both. In still another embodiment, separate voltage regulators are introduced in each voltage supply domain. In yet another embodiment separate bandgap references for each voltage regulator are introduced for further isolation. In another embodiment bypass capacitors are introduced and coupled to each local voltage supply and local ground in each voltage supply domain. Alternate embodiments use and/or combine the preceding techniques for a variety of components on the integrated phase locked loop and power amplifier circuit for isolation. For example, the mixer on the integrated phase locked loop and power amplifier circuit can be powered with a separate voltage supply domain having a local voltage supply and local ground with a separate high isolation ring, voltage regulator, bandgap reference and bypass capacitor.

Figure 1:
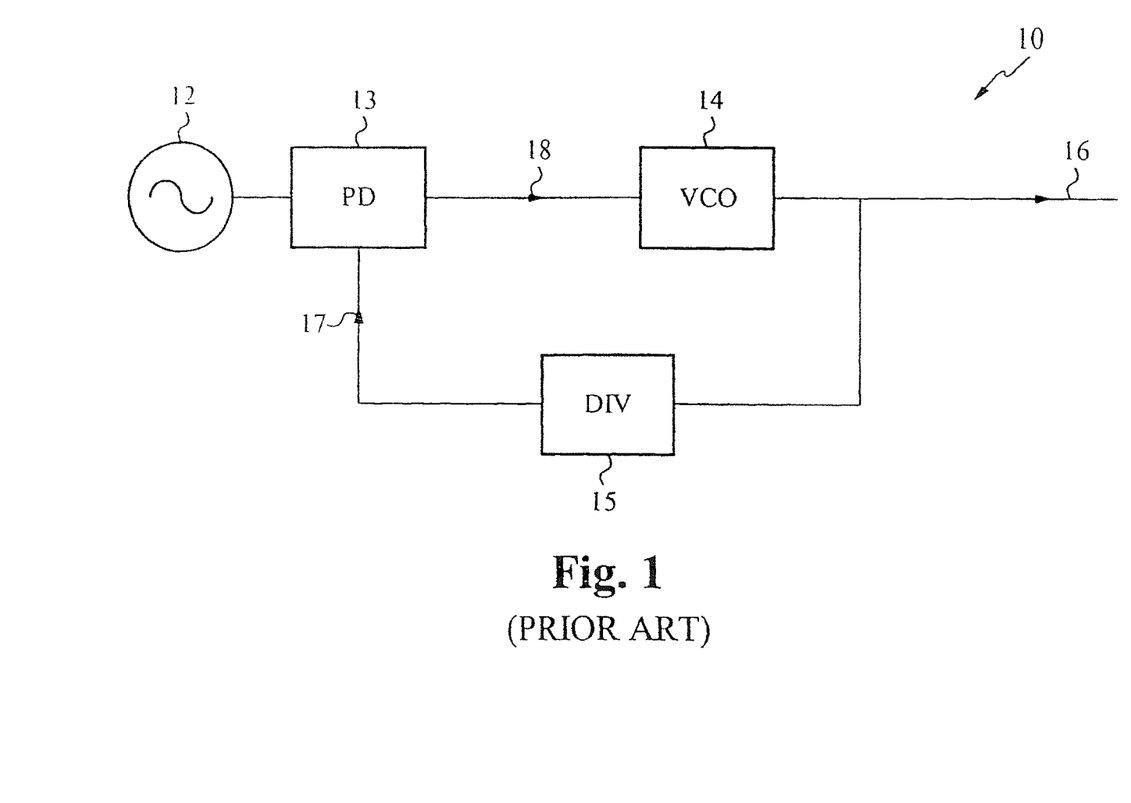
FIG. 1 illustrates a block diagram of a phase locked loop circuit of the prior art.

A PLL 10 in the prior art is illustrated in FIG. 1. In the embodiment illustrated in FIG. 1, a reference frequency 12 is coupled to a phase detector 13. An output of the phase detector 13 is coupled to a voltage controlled oscillator (VCO) 14. The VCO generates an output frequency 16. A divider 15 is configured to receive the output frequency 16 of the VCO and transmit a manipulated frequency 17 to the phase detector 13. The phase detector 13 is also configured to receive the manipulated frequency 17 of the divider 15. If the phase between the two signals is different, the phase detector 13 outputs a voltage control signal 18 to the VCO 14. The voltage control signal 18 causes the oscillation of the VCO 14 to adjust until the phase of the frequency 12 and the manipulated frequency 17 are equal. The output frequency 16 of the PLL 10 is the frequency at which the VCO 14 operates.

Figure 2:
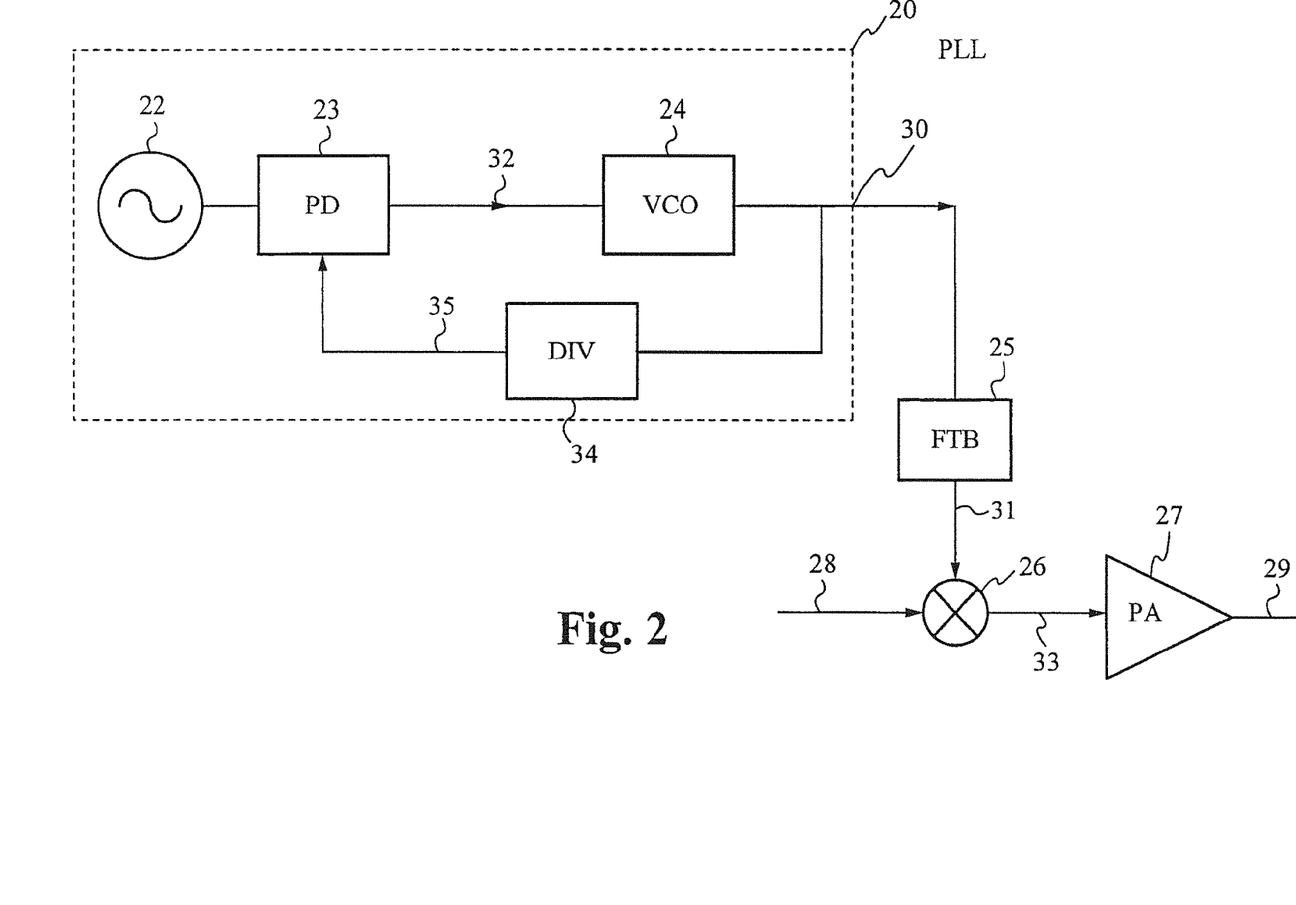
FIG. 2 illustrates a block diagram of an integrated phase locked loop and power amplifier circuit with a frequency translation block of the present invention.

An integrated phase locked loop and power amplifier circuit with a frequency translation block is illustrated in FIG. 2. In the embodiment illustrated in FIG. 2, the PLL 20 includes a reference frequency 22 coupled to a phase detector 23. The phase detector 23 is coupled to a VCO 24. The phase detector 23 is configured receive the reference frequency 22 and the output frequency 30 of the VCO 24. The phase detector 23 outputs a voltage control signal 32 to the VCO 24. The voltage control signal 32 adjusts the oscillation of the VCO 24 until the phase of the output frequency 30 matches the phase of the reference frequency 22. Preferably, the output frequency 30 of the PLL 20 is an integer or fractional multiple of the reference frequency 22. Alternatively, a divider 34 is placed in the feedback path 35 between the VCO 24 and phase detector 23.

In the embodiment illustrated in FIG. 2, the PLL 20 is coupled to a frequency translation block 25. The frequency translation block 25 is configured to receive the output frequency 30 of the PLL 20. The frequency translation block 25 modulates the output frequency 30 and transmits a modulated frequency 31. Preferably, the frequency translation block 25 is an N/2 divider. In addition, the frequency translation block 25 preferably includes a high isolation component to filter unwanted feedback. The frequency translation block 25 is coupled to a mixer 26. The mixer 26 is configured to receive the modulated frequency 31 and an input signal 28. The mixer 26 modulates the input signal 28 with the modulated frequency 31 thereby forming a modulated signal 33. The mixer 26 is coupled to a PA 27. The PA 27 is configured to receive the modulated signal 33 transmitted by the mixer 26. The PA 27 amplifies the modulated signal 33 thereby forming an output signal 29. The PA 27 transmits the output signal 29, for example to an antenna. Preferably, the input signal is a data or voice signal, or both. In the embodiment shown in FIG. 2, the VCO 24 operates at a substantially different frequency than the PA 27 due to the modulation of the frequency translation block 25. By way of example, the VCO 24 operates at 3.8 GHz while the PA 27 operates at 1.9 GHz thus diminishing the possibility for cross-talk. Preferably, the circuit of FIG. 2 is formed on a single integrated circuit chip. Other frequencies are contemplated and within the scope of the invention.

In alternate embodiments, the PLL 20 can be designed in any convenient and/or known manner. By way of example, the PLL 20 can include a divider, low-pass filter, high-pass filter, or a bandpass filter, or any combination of the above listed to produce a desired output frequency 30. Also, the frequency translation block 25 can be any convenient and or known device designed to manipulate the output frequency 30 of the PLL 20 and transmit a modulated frequency 31. In alternate embodiments, any number of frequency translation blocks 25 can be introduced in any convenient or known manner. For example, two N/2 translation blocks can be used to modulate the output frequency 30 and transmit a modulated frequency 31. This example would be equivalent of an N/4 frequency translation block. In addition, by way of example, a frequency translation block can be introduced between the mixer 26 and the PA 27 to differ the operating frequency of those circuit components. Alternatively, a divider 34 can be placed in the feedback path 35 from the VCO 24 to the phase detector 23.

Figure 3:
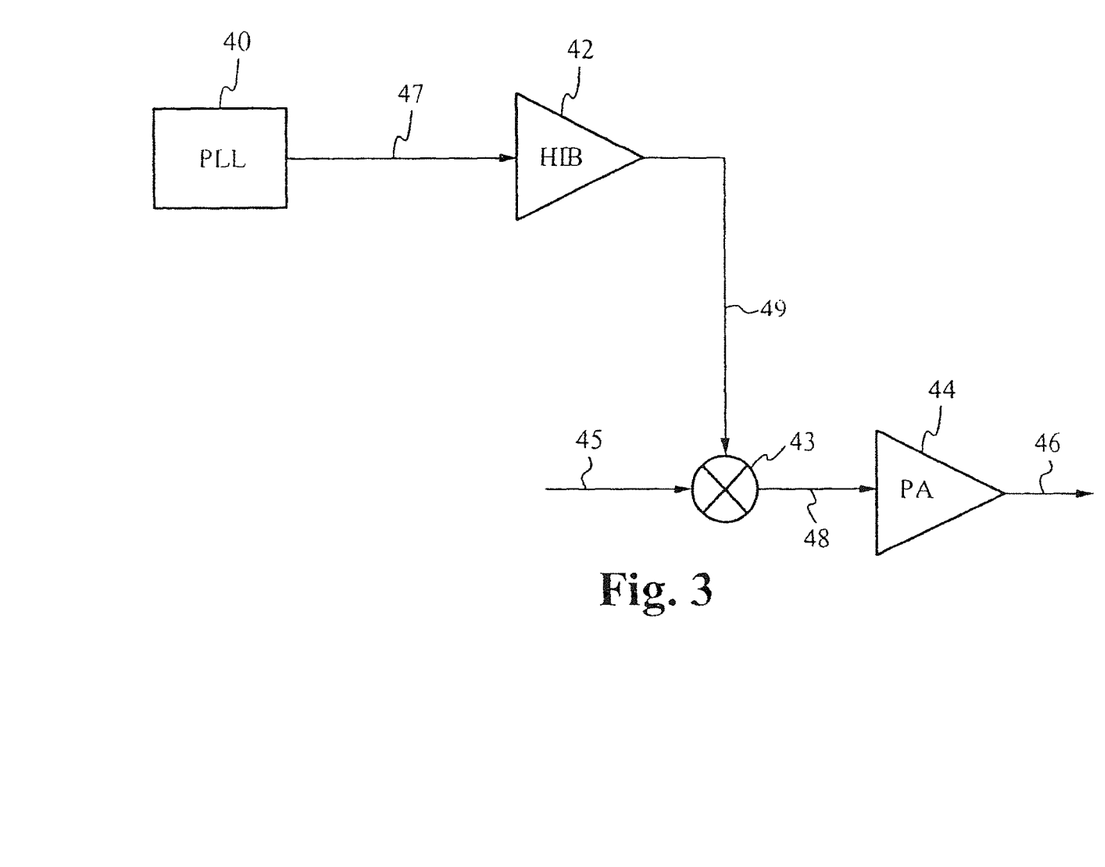
FIG. 3 illustrates a block diagram of an integrated phase locked loop and power amplifier circuit with a high isolation buffer of the present invention.

An integrated phase locked loop and power amplifier circuit with a high isolation buffer is illustrated in FIG. 3. In the embodiment illustrated in FIG. 3, a PLL 40 is coupled to a high isolation buffer 42. The PLL 40 is configured to transmit an output frequency 47. The high isolation buffer 42 is configured to receive the output frequency 47 of the PLL 40 and transmit an isolated signal 49 at the same frequency. Preferably, the high isolation buffer 42 is a high isolation amplifier. The high isolation buffer 42 is coupled to a mixer 43. The mixer 43 is configured to receive the output frequency 49 and an input signal 45. The mixer 43 modulates the input signal 49 with the isolated frequency output 49 thereby forming a modulated signal 48. The mixer 43 transmits the modulated signal 48 to the PA 44. The PA 44 is coupled to the mixer 43 and configured to receive the modulated signal 48. The PA 44 amplifies the modulated signal thereby forming an output signal 46. The PA 44 transmits the output signal 46, such as to an antenna. Preferably, the input signal 45 is a data and/or voice signal. In the embodiment illustrated in FIG. 3, the high isolation buffer 42 isolates the PLL 40 from any unwanted feedback, noise, or both, generated by the PA 44.

In alternate embodiments additional high isolation buffers can be introduced to further isolate the components. For example, a high isolation buffer can be introduced between the mixer 43 and the PA 44 to further isolate those circuit components from unwanted feedback.

Figure 4:
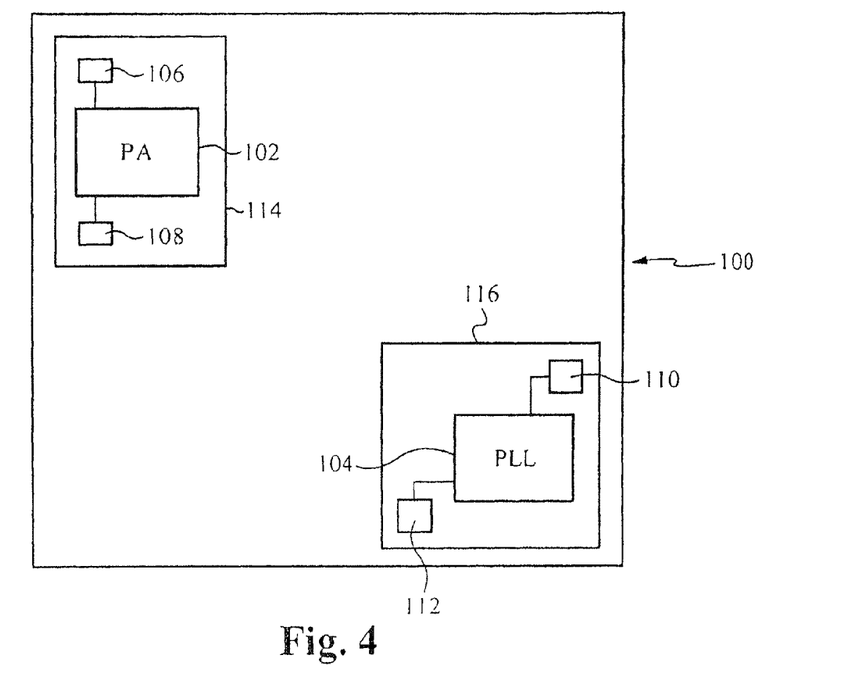
FIG. 4 illustrates a schematic layout for an integrated circuit according to the present invention.

In a conventional integrated circuit, the closer circuits are to one another the more likely that there will be cross talk and leakage between the circuits. FIG. 4 shows a schematic layout for an integrated circuit according the present invention. In particular the integrated circuit 100 includes a PA 102 and a PLL 104. As cross talk and leakage between these circuits provides a largest potential for degrading performance of the overall circuit, the PA 102 and the PLL 104 are placed on the circuit away from one another. In the schematic of FIG. 4, the PA 102 and the PLL 104 are formed in opposite corners of the integrated circuit 100 to maximize their physical separation.

Unlike conventional integrated circuits, to further isolate the circuits of the PA 102 and the PLL 104, they are individually coupled to power supply connections VCC and ground. The PA 102 is provided with a PA-VCC connection 106 and a PA-ground connection 108. Likewise, the PLL 104 is provided with a PLL-VCC connection 110 and a PLL-ground connection 112. This requires additional bond pads for the integrated circuit and requires extra pins if the integrated circuit is assembled in a package which is contrary to convention design practices.

In addition, the PA 102 and the PLL 104 each have a guard ring set, 114 and 116, respectively. The guard ring sets further isolate the PA 102 from the PLL 104. It will be apparent that other subsystems can and are likely to be formed on the integrated circuit 100. Each such subsystem on the integrated circuit 100 can have an individual VCC bond pad, ground bond pad and isolation ring.

Figure 5:
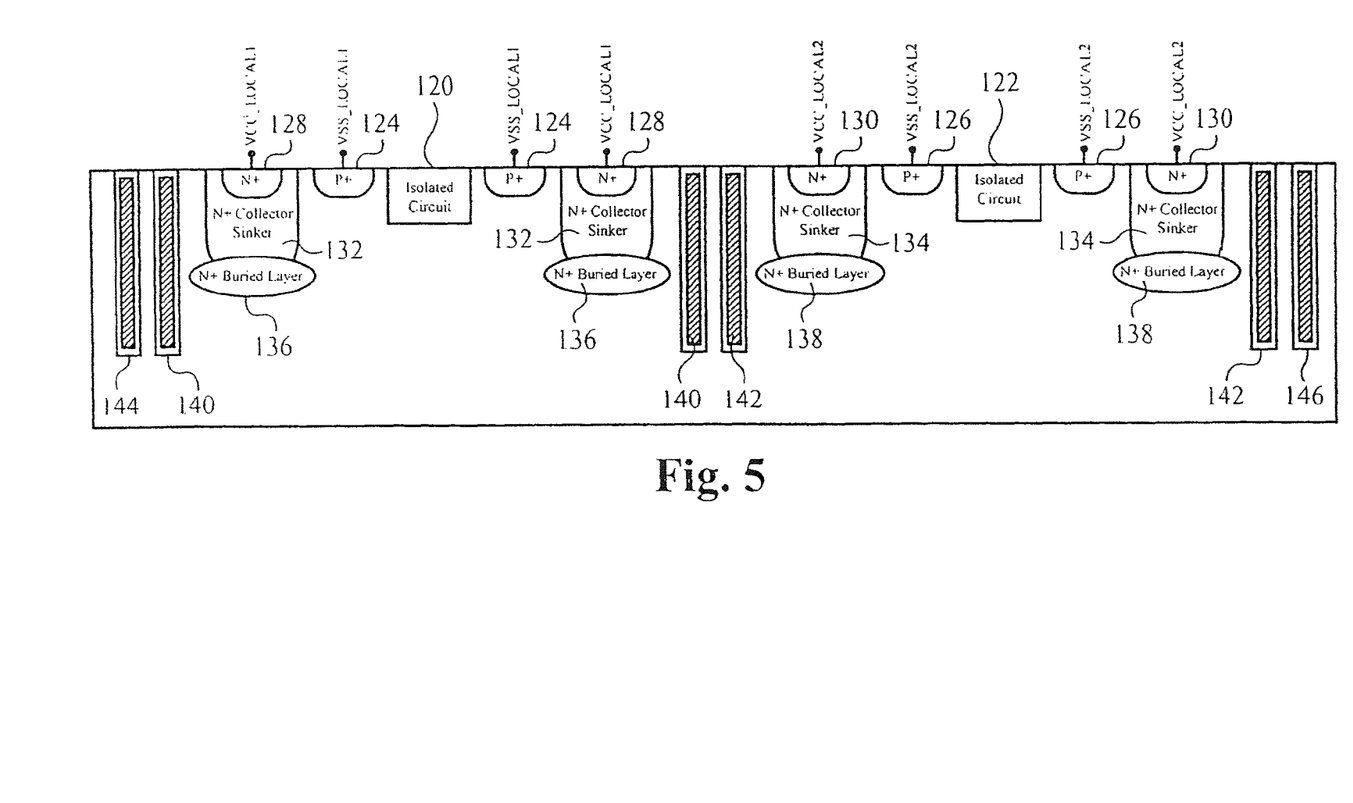
FIG. 5 illustrates a schematic cross section of the fabrication for circuit isolation of the present invention.

FIG. 5 shows a schematic cross section of an isolation ring according to the present invention. The circuit to be isolated is formed inside the ring. Two representative circuits to be isolated 120 and 122 are provided. The circuits to be isolated 120 and 122 can be the PA and the PLL, respectively. However, these circuits are shown as adjacent one another to allow the drawing to be reasonably sized. Recall that in the preferred embodiment the PA and the PLL are preferably located as far as physically possible from one another on the chip. Each circuit to be isolated is surrounded by a ground ring 124 and 126 for the local ground connection. The ground rings 124 and 126 are preferably formed of a high dose p-type material. The ground rings 124 and 126 are each surrounded by a VCC ring 128 and 130, respectively. It is possible to reverse the order of the rings. The VCC rings 128 and 130 are preferably formed of a high dose n-type material. More preferably, the integrated circuit 100 (FIG. 4) is formed using a bipolar or bi-CMOS process. In such a case, the VCC rings 128 and 130 are enhanced with a high dose n-type collector region 132 and 134, respectively. The VCC rings 128 and 130 are preferably further enhanced with a high dose n-type buried layer 136 and 138, respectively. Because the VCC connections are formed of high dose n-type material and the ground connections are formed of high dose p-type material, a reverse biased diode is formed surrounding the circuits to be isolated 120 and 122. Because the circuits form reverse biased diodes, a depletion region is formed surrounding these reverse biased diodes further isolating the circuits 120 and 122 from their respective neighbors. Additionally, the VCC rings 128 and 130 are surrounded by deep trench rings 140 and 142, respectively. Adjacent deep trench rings 144 and 146 are shown for surrounding other circuits to be isolated. The deep trench rings 144 and 146 are formed by cutting a trench in the silicon 1-2 microns wide, and 4-6 microns deep. The trench is formed by forming a deep opening in the substrate. The sides of the deep opening are covered with insulating oxide, and the remaining opening is filled with bulk poly. Preferably, the deep trench rings 144 and 146 are formed deeper than the VCC rings 136 and 138, and the VCC rings 136 and 138 are formed deeper than the ground rings 124 and 126. Alternatively, the deep trench rings 144 and 146 are at least as deep as the VCC rings 136 and 138, and the VCC rings 136 and 138 in turn are at least as deep as the ground rings 124 and 126.

Figure 6:
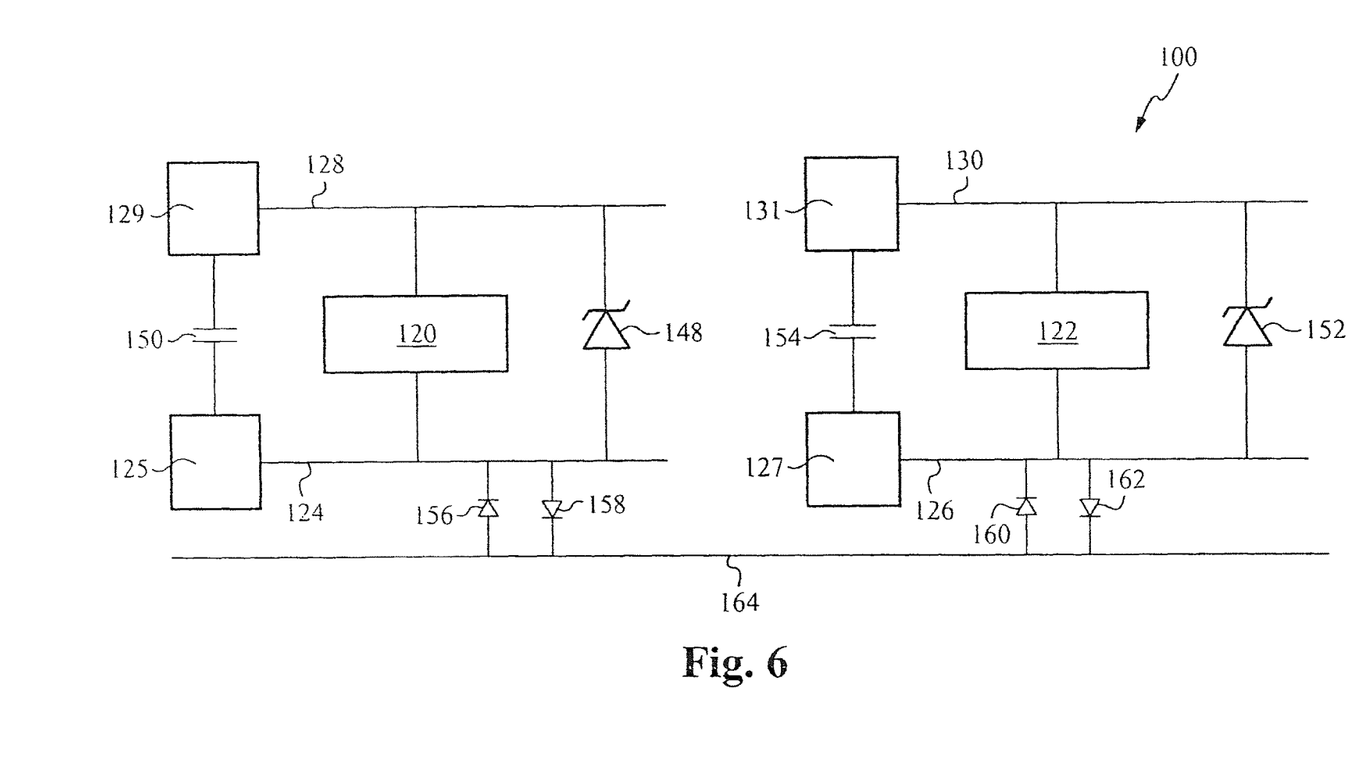
FIG. 6 illustrates a block circuit diagram of an integrated phase locked loop and power amplifier circuit with separate voltage supply domains and ESD protection of the present invention.

FIG. 6 shows a circuit block diagram of the system of FIG. 5. Identical elements are labeled with the same reference numerals. The local ground ring 124 is coupled to a bond pad 125 and surrounds the circuit to be isolated 120. The local VCC ring 128 is coupled to a bond pad 129 and surrounds the local ground ring 124. An external capacitor 150 is coupled between the bond pads 125 and 129 to filter supply noise. A reverse biased diode 148 is integrally formed and coupled between the local ground ring 124 and the local VCC 128. Preferably the reverse biased diode 148 is a diode coupled NPN transistor and is formed as sufficiently large to absorb an ESD event. The local ground ring 126 is coupled to a bond pad 127 and surrounds the circuit to be isolated 122. The local VCC ring 130 is coupled to a bond pad 131 and surrounds the local ground ring 126. An external capacitor 154 is coupled between the bond pads 127 and 131 to supply filter noise. A reverse biased diode 152 is integrally formed and coupled between the local ground ring 126 and the local VCC 130. Preferably the reverse biased diode 152 is a diode coupled NPN transistor and is formed as sufficiently large to absorb an ESD event. The integrated circuit 100 includes an ESD ground 164. The local ground 124 is coupled to the ESD ground 164 by a pair of diodes 158 and 156 which are coupled anti-parallel to one another. Likewise, the local ground 126 is coupled to the ESD ground 164 by a pair of diodes 160 and 162 which are coupled anti-parallel to one another. This allows the isolated circuits to remain separate and each have adequate ESD protection with isolated supplies.

Figure 7:
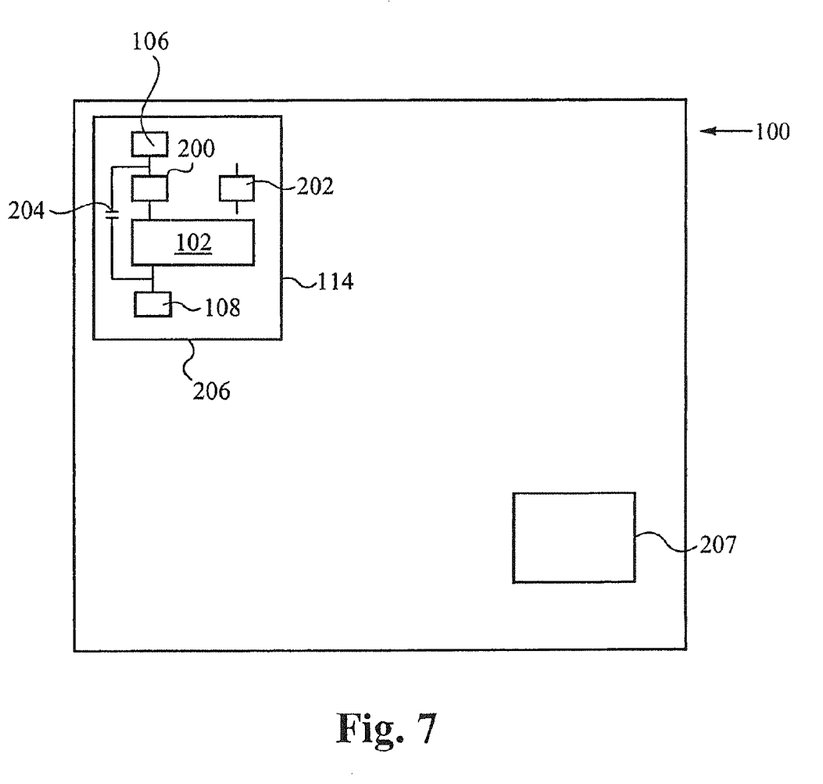
FIG. 7 illustrates a block diagram of a representative voltage supply domain with a voltage regulator of the present invention.

FIG. 7 shows a representative power supply domain 206 for the present invention. For example, the integrated circuit of FIG. 4 includes a separate power supply domain for the PA 102 which includes a VCC bond pad 106 and a ground bond pad 108. The PA power supply domain, as all power supply domains on the integrated circuit 100, includes a voltage regulator 200 circuit, a band gap reference 202 and at least one integrated capacitor 204 between each local VCC and each local ground. By way of example, a second circuit element 207 is shown placed as far away as possible from the power supply domain Traditionally, a trace is used to electronically couple a transistor port to a PAD, which in turn is coupled to a pin via a bond wire, illustrated in FIG. 8. Existing layout techniques to reduce the interconnection parasitic inductance and resistance, by increasing the width ($W_a$) of the trace 300 that is coupled to a port of a transistor 301, such as an emitter or collector, are not sufficiently successful due to the skin depth effect discussed above.

Figure 13:
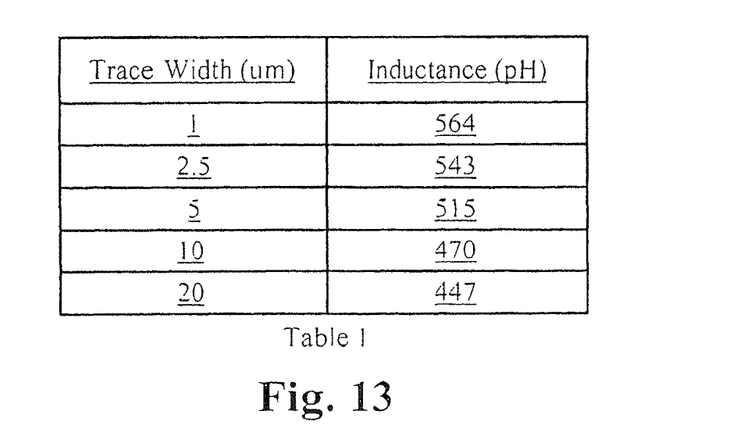
FIG. 13 is a table which shows various trade widths and their respective parasitic inductances.

Table 1, found in FIG. 13, lists the self inductance of rectangular trace with metal thickness of 5 μm, made of aluminum, for a length of 0.5 mm as a function of width at 5.8 GHz. Table 1 clearly demonstrates that significant changes in the line width (by as much as 20 times) can only reduce the inductance by less than 20%. Thus, for high frequency integrated power amplifiers, a more effective technique of reducing parasitic inductance must be devised.

Figure 9:
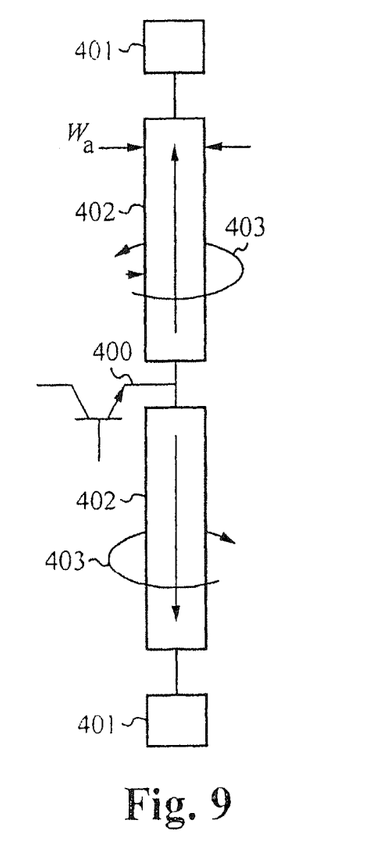
FIG. 9 illustrates current divided evenly through two traces coupled to a transistor port.

FIG. 9 illustrates the current divided to flow in opposite directions through parallel traces. The current of a transistor port 400 such as an emitter or collector is divided into to equal parts and coupled to separate pads 401 and traces 402. The orientation of the traces are such that their respective magnetic fields 403 have opposite polarity resulting in lower effective inductance and half the parasitic resistance. The advantage of this technique can be verified by examining the equivalent circuit of the two parallel coupled inductors in FIG. 10.

Figure 8:
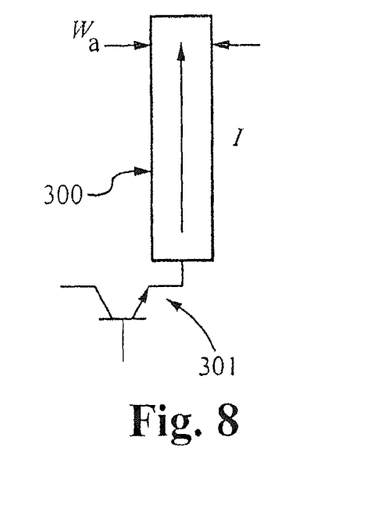
FIG. 8 illustrates current flowing through a trace coupled to a transistor port.

If the width ($W_a$) of each individual trace 402 in FIG. 9 is equivalent to the trace 300 in FIG. 8, the resistance of the transistor port 400 of the circuit in FIG. 9 is half of the transistor port 401 circuit in FIG. 8. Moreover, where the original method in FIG. 8 has only one pad, the new technique uses two pads and therefore reduces the bondwire resistance substantially by one half.

Figure 10:
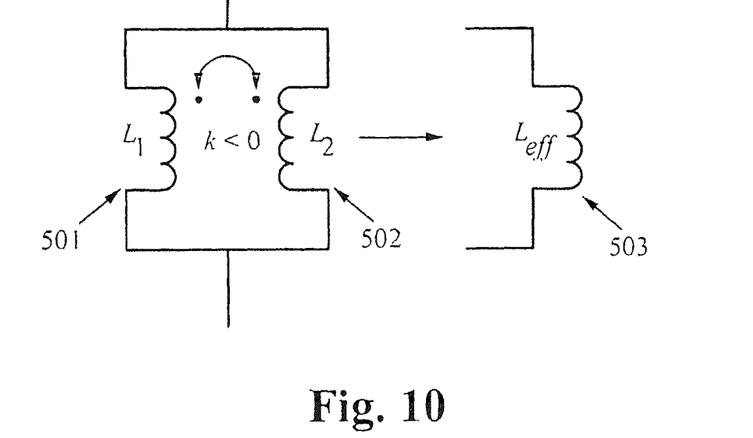
FIG. 10 illustrates inductive coupling between two inductors.

FIG. 10 shows two discrete inductor elements 501 and 502 labeled $L_1$ and $L_2$ respectively that naturally couple into one effective inductor 503. This is a well understood phenomenon known as inductive coupling.

Figure 11:
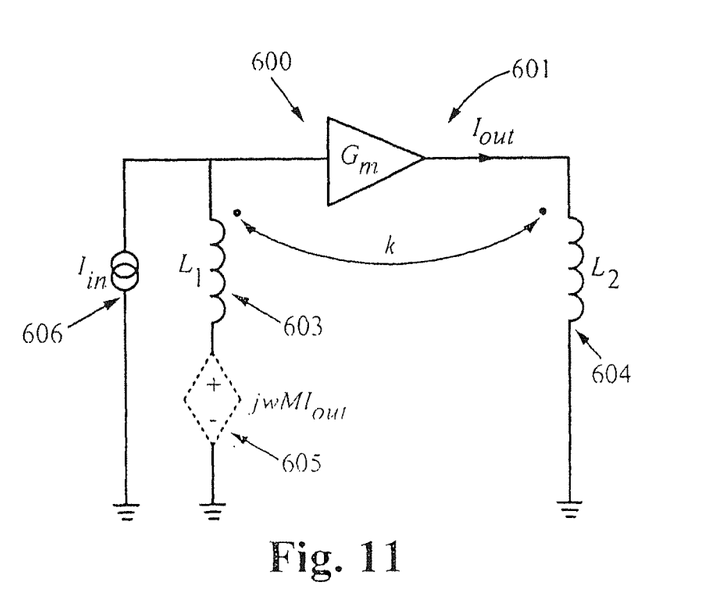
FIG. 11 illustrates parasitic elements in an integrated amplifier.

FIG. 11 illustrates the effect of undesired coupling between the input trace 600 and output trace 601 of an amplifier 602. The parasitic inductance of the input trace 603 and output trace 604 couple to introduce unwanted inputs 605 from the output of the amplifier 602 and these unwanted inputs 605 manifest themselves as disturbances to the input signal 606 and can cause instability in the amplifier.

Figure 12:
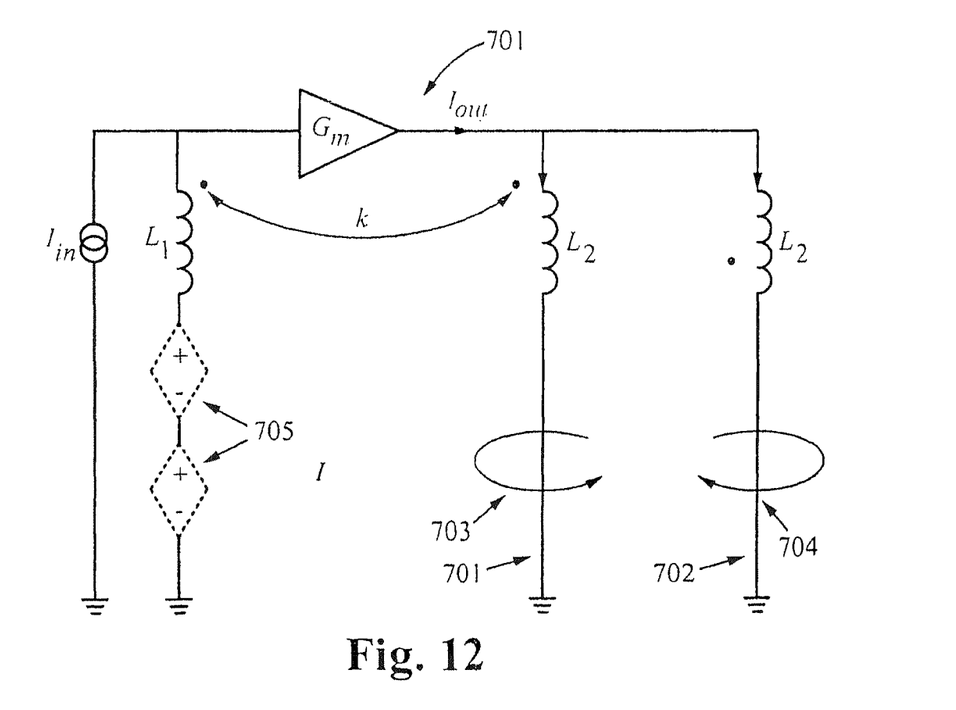
FIG. 12 illustrates parasitic elements nullified by the disclosed invention.

FIG. 12 shows the solution to the problem shown in FIG. 11. The output of the amplifier 701 is divided into equal size traces 701 and 702 which have been oriented so that their magnetic fields 703 and 704 are opposite in polarity, resulting in lower effective inductance and half the parasitic resistance. Preferably, the traces 701 and 702 can be oriented such that the unwanted inputs are substantially suppressed.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. For example, different logic circuit configurations could be substituted for the logic circuit described above to perform the functions of the embodiments illustrated.

What is claimed is:

1. An integrated phase locked loop and power amplifier circuit comprising:
   a phase locked loop circuit configured to transmit an output frequency;
   a frequency translation block with high isolation coupled to the phase locked loop circuit configured to receive the output frequency, modulate the output frequency thereby forming a modulated frequency, and transmit the modulated frequency;
   a mixer coupled to the frequency translation block configured to receive the modulated frequency and an input signal, modulate the modulated frequency with the input signal thereby forming a modulated signal, and transmit the modulated signal;
   a power amplifier coupled to the mixer configured to receive the modulated signal, amplify the modulated signal thereby forming an output signal, and transmit the output signal;
   at least one first high isolation buffer coupled between the phase locked loop circuit and the frequency translation block and configured to receive the output frequency from the phase locked loop circuit and to transmit the output frequency to the frequency translation block; and
   at least one second high isolation buffer coupled between the mixer and the power amplifier and configured to receive the modulated signal from the mixer and to transmit the modulated signal to the power amplifier.

2. The integrated phase locked loop and power amplifier circuit as claimed in claim 1 wherein the frequency translation block is a divider.

3. The integrated phase locked loop and power amplifier circuit as claimed in claim 2 wherein the divider is N/2.

* * * * *